United States Patent
Mann

(10) Patent No.: US 8,842,284 B2
(45) Date of Patent: Sep. 23, 2014

(54) MAGNIFYING IMAGING OPTICAL UNIT AND METROLOGY SYSTEM INCLUDING SAME

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 191 days.

(21) Appl. No.: 13/357,222

(22) Filed: Jan. 24, 2012

(65) Prior Publication Data

US 2012/0140454 A1 Jun. 7, 2012

Related U.S. Application Data

(63) Continuation of application No. PCT/EP2010/004519, filed on Jul. 23, 2010.

(30) Foreign Application Priority Data

Jul. 29, 2009 (DE) .......................... 10 2009 035 583

(51) Int. Cl.
*G01N 21/00* (2006.01)
*G02B 17/06* (2006.01)
*G03F 7/20* (2006.01)

(52) U.S. Cl.
CPC ........ *G03F 7/70233* (2013.01); *G02B 17/0663* (2013.01)
USPC ............................ 356/445; 356/601; 359/850

(58) Field of Classification Search
USPC ......... 359/365–366, 850, 354–359, 726–732; 250/492.1–492.2; 356/237.1–237.5, 356/401, 445, 601, 625; 378/34–35; 101/450.1–473; 430/302–305; 355/53
See application file for complete search history.

(56) References Cited

U.S. PATENT DOCUMENTS

| 5,071,240 | A | 12/1991 | Ichihara et al. |
| 5,291,340 | A | 3/1994 | Kashima |
| 6,238,830 | B1 | 5/2001 | Rangarajan et al. |
| 6,894,834 | B2 | 5/2005 | Mann et al. |
| 2005/0180011 | A1* | 8/2005 | Mann et al. .................. 359/499 |

FOREIGN PATENT DOCUMENTS

| DE | 102 20 815 A1 | 11/2003 |
| DE | 103 45 783 A1 | 4/2005 |
| DE | 10 2006 059 436 A1 | 6/2008 |
| WO | WO 2005/096060 | 10/2005 |
| WO | WO 2006/069725 | 7/2006 |

OTHER PUBLICATIONS

H. Gross, Handbook of Optics, vol. 1, Wiley-VCH-Verlag, Weinheim, 2005, p. 514, formula 11-37.
International Search Report for corresponding PCT/EP2010/004519, dated Sep. 20, 2010.

* cited by examiner

*Primary Examiner* — Jennifer L. Doak
(74) *Attorney, Agent, or Firm* — Fish & Richardson P.C.

(57) ABSTRACT

A magnifying imaging optical unit has at least four mirrors to image an object field in an object plane into an image field in an image plane. An absolute value of the Petzval radius of the image field is greater than 500 mm. The imaging optical unit can be used to inspect with sufficient imaging quality relatively large mask sections of lithography masks used during projection exposure to produce large scale integrated semiconductor components.

20 Claims, 6 Drawing Sheets

MAGNIFYING IMAGING OPTICAL UNIT AND METROLOGY SYSTEM INCLUDING SAME

CROSS-REFERENCE TO RELATED APPLICATIONS

This application is a continuation of, and claims benefit under 35 USC 120 to, international application PCT/EP2010/004519, filed Jul. 23, 2010, which claims benefit under 35 USC 119 of German Application No. 10 2009 034 583.9, filed Jul. 29, 2009. International application PCT/EP2010/004519 is hereby incorporated by reference in its entirety.

FIELD

The disclosure relates to a magnifying imaging optical unit and to a metrology system including such an imaging optical unit.

BACKGROUND

A magnifying imaging optical unit is known for the simulation and analysis of effects of properties of masks for microlithography from DE 102 20 815 A1. Further imaging optical units are known from U.S. Pat. No. 6,894,834 B2, WO 2006/0069725 A1 and U.S. Pat. No. 5,071,240.

SUMMARY

The disclosure provides an imaging optical unit that provides sufficient imaging quality even when used for inspecting relatively large mask sections of lithography masks which are used during projection exposure for producing large scale integrated semiconductor components.

In some embodiments, a magnifying imaging optical unit includes at least four mirrors which image an object field in an object plane into an image field in an image plane. The imaging optical unit has an absolute value of a Petzval radius that is greater than 500 mm, and the imaging optical unit has an imaging scale that is greater than 500.

It has been recognized according to the disclosure that a large Petzval radius leads to the possibility of imaging even relatively large sections of an object arranged in the object field into a planar image field with sufficient imaging quality. The imaging optical unit is therefore suited, in particular, to scanning lithography masks used during projection exposure for producing semiconductor components for patterning errors and to imaging them onto a planar detection field in which, for example, a CCD chip can be accommodated. A large-area detection, in particular of mask defects, is therefore possible with the imaging optical unit. Such a process is known as PMI (Patterned Mask Inspection). The absolute value of the Petzval radius of the imaging field can be greater than 500 mm (e.g., 659 mm, greater than 1000 mm, 1452 mm, greater than 1500 mm, 1874 mm, greater than 2000 mm, 2469 mm, greater than 2500 mm, 2907 mm, greater than 4000 mm, greater than 5000 mm, 5027 mm). The object field can be arranged off-axis, that is to say at a distance from an optical axis. The imaging scale greater than 500 leads to good suitability of the imaging optical unit in the context of a metrology and inspection system. The imaging scale can be greater than 600 and can be, in particular, 750.

The imaging optical unit can, of course, also be used in inverted fashion as a reducing imaging optical unit, wherein object field and image field then swap their function and the ratio between object size and image size is used as the imaging scale. When object-side components of the imaging optical unit are mentioned below, those components on the high-aperture side of the imaging optical unit are meant. When image-side components of the imaging optical unit are mentioned, the components on the low-aperture side are meant. If the imaging optical unit is used as a reducing imaging optical unit, the light path of imaging light passes from the low-aperture side toward the high-aperture side of the imaging optical unit. The two mirrors closest to the field in the imaging beam path on the high-aperture side of the imaging optical unit can be concave. This leads to the possibility of a well-corrected design of the imaging optical unit.

A ratio of the absolute value of the Petzval radius and a structural length of the imaging optical unit of at least 0.4 leads to a particularly small influence of the image field curvature on the imaging quality. The ratio of the absolute value of the Petzval radius and a structural length of the imaging optical unit can be at least 0.5 (e.g., at least 1.0, at least 1.5, 1.66, 1.94).

The structural length is the distance between the two components of the imaging optical unit that are arranged furthest away from one another, where the object field and/or the image field are/is also understood as components in this context. In general, therefore, the structural length is the distance between the object field and the image field. However, if, for example, one of the mirrors is further away from one of the fields than the two fields are spaced apart from one another, the distance between one of the fields and the component furthest away from that field can also be involved. The structural length here always relates to an unfolded beam path, that is to say to an imaging optical unit without ray deflection via plane mirrors.

If the imaging optical unit has at least one mirror without a passage opening for the passage of imaging light, that is to say having a continuously used reflection surface, this simplifies the production of the imaging optical unit.

An object field size of at least 0.01 $mm^2$ is suitable particularly for a PMI application. The object field can have, in particular, the dimensions of 0.2 mm×0.2 mm, 0.6 mm×0.6 mm, 1.0 mm×0.2 mm, or 1.0 mm×0.4 mm. Relatively large object fields such as, for example, object field dimensions of 1.0 mm×0.2 mm or 1.0 mm×0.4 mm, can be fostered by the use of an off-axis field.

An object-side numerical aperture of at least 0.0625 is well adapted to the imaging relationships of projection lenses of projection exposure apparatuses for EUV microlithography for producing micro- or nanostructured components. The object-side numerical aperture can be at least 0.0825 (e.g., at least 0.125, at least 0.2, 0.3). The higher the object-side numerical aperture, the more diverse the possibilities for using the imaging optical unit, in particular in connection with a metrology system. The imaging optical unit can be designed such that it is possible to change between these numerical apertures with the aid of an aperture stop.

An object-side chief ray angle of at least 6° is likewise adapted to the conditions during EUV projection exposure. The object-side chief ray angle can also be 8°. The imaging optical unit can be designed for a plurality of chief ray angles between which it is possible to change with the aid of an aperture stop. The same aperture stop with which, if appropriate, the object-side numerical aperture can be set can be involved here. The chief ray angles discussed above can be present on the high-aperture side of the imaging optical unit.

The imaging optical unit can be telecentric. A configuration of the imaging optical unit that is telecentric on the image side prevents a situation in which, upon defocusing of, for example, a detector element in the image plane, a lateral position of the image points also changes. The configuration that is telecentric on the image side therefore prevents scale and distortion aberrations from arising in the case of such image-side displacement.

A maximum angle of incidence of a chief ray of a central field point on one of the mirrors of 11° allows for a configuration of the imaging optical unit with a highly reflective multilayer coating for optimizing the used light throughput of the imaging optical unit.

A maximum wavefront aberration (rms) of 25 mλ and a maximum distortion of 1000 nm lead to a particularly high imaging quality of the imaging optical unit. The maximum wavefront aberration (rms) can be 37.6 mλ, 26.0 mλ, 11.6 mλ, 10.7 mλ or 6.4 mλ. The maximum distortion can be 5.7 μm, 3.0 μm, 2.0 μm, 1.0 μm, 0.8 μm or even 0.4 μm.

The advantages noted above can also be provided by a metrology or inspection system including an imaging optical unit as disclosed herein.

BRIEF DESCRIPTION OF THE DRAWINGS

Exemplary embodiments of the disclosure are explained in greater detail below with reference to the drawings, in which.

DETAILED DESCRIPTION

Figure 1:
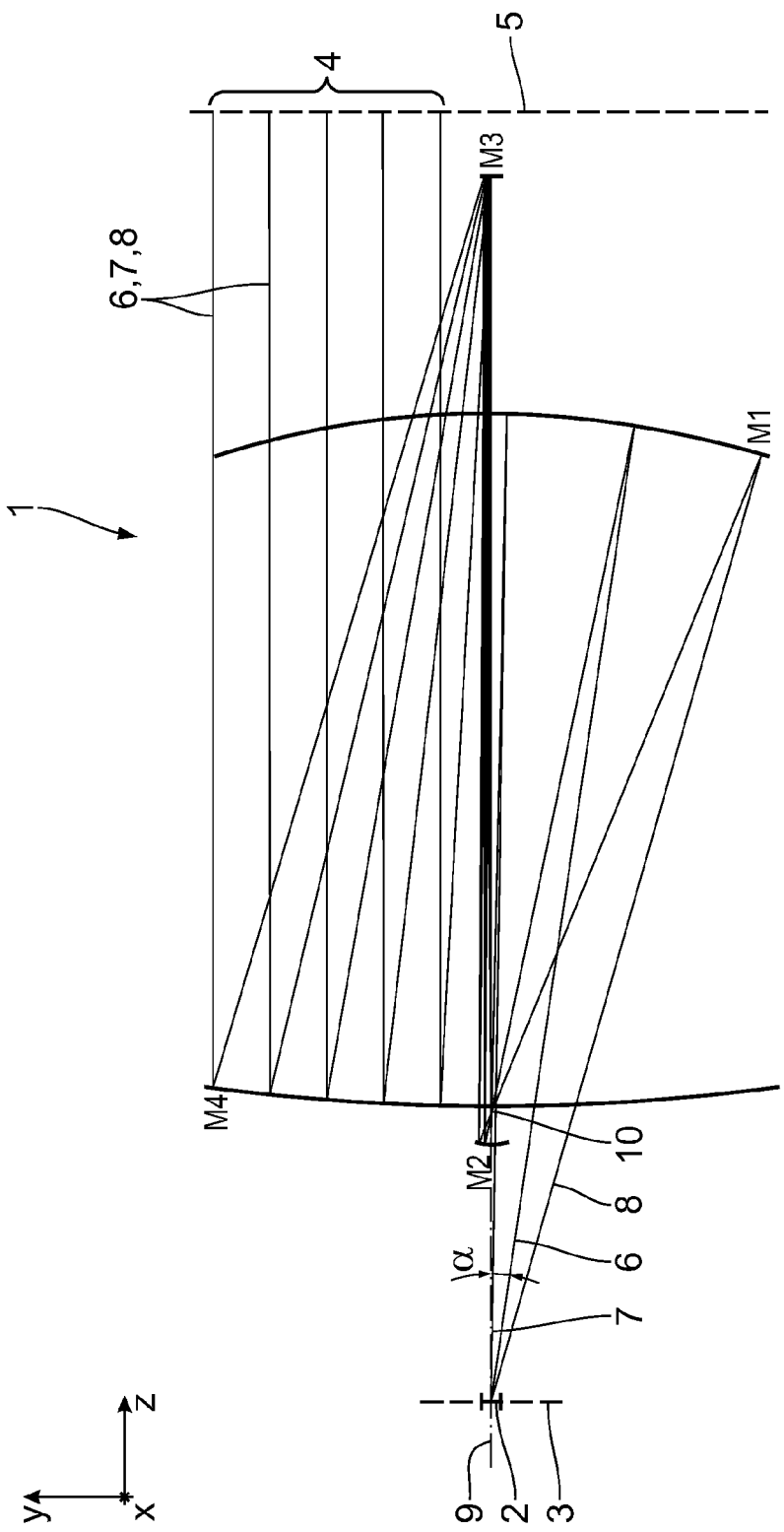
FIG. 1 shows a meridional section through a first embodiment of a magnifying imaging optical unit for use in a metrology system for simulation and for analysis of effects of properties of lithography masks on optical imaging within a projection optical unit of a projection exposure apparatus for microlithography and for the large-area detection of mask defects.

FIG. 1 illustrates a magnifying imaging optical unit used in a metrology system for the scanning analysis of a lithography mask for patterning errors. Such a metrology system is also referred to as a PMI (Patterned Mask Inspection) tool. In a subsequent analysis step, a patterning error detected by the PMI tool can be examined more accurately with the aid of an analysis of a so-called aerial image (Aerial Image Metrology System, AIMS). The metrology system serves for simulation and analysis of the effects of properties of lithography masks, which are in turn used during projection exposure for producing semiconductor components, on the optical imaging of projection optical units within the projection exposure apparatus. AIMS systems are known from DE 102 20 815 A1. The PMI tool having the magnifying imaging optical unit 1 as a component part has a significantly larger object field 2 by comparison with an AIMS system. The imaging optical unit 1 having such a large field permits use both in a PMI mode and in an AIMS mode through corresponding design of the illumination.

The imaging optical unit 1 images the object field 2 in an object plane 3 with a magnification factor of 750 into an image field 4 in an image plane 5. The lithography mask to be measured, which is also referred to as a reticle, can be arranged in the object field 2. A CCD chip of a CCD camera that is sensitive to the imaging wavelength can be arranged in the image field 4 for the analysis of the magnified image generated.

In order to facilitate the representation of positional relationships, a Cartesian xyz coordinate system is used below. The x-axis runs perpendicularly to the plane of the drawing into the latter in FIG. 1. The y-axis runs upwards in FIG. 1. The z-axis runs towards the right in FIG. 1.

FIG. 1 illustrates the course of chief rays 6 and of coma rays 7, 8 which emerge from five object field points lying one above another in the y-direction. The chief rays 6, on the one hand, and the coma rays 7, 8 on the other hand, are also designated as imaging rays hereinafter.

The object field 2, on the one hand, and the image field 4, on the other hand, lie in xy planes spaced apart from one another. The object field 2 has in each case an extent of 0.2 mm in the x-direction and in the y-direction, that is to say has a field size of 0.2×0.2 mm².

The chief rays 6 emerge in the imaging beam path between the object field 2 and the image field 4 from the object field 2 with a chief ray angle $\alpha$ of 8° with respect to a normal 9—running in the z-direction—to a central object field point of the object plane 3. Other chief ray angles $\alpha$ of, for example, 9°, 10° or even larger, are possible, depending on the aperture chosen, and may be involved to separate an illumination beam path from the imaging beam path.

An object-field-side numerical aperture of the imaging optical unit 1 is NAO=0.125. With the aid of a decenterable aperture stop, the object-field-side numerical aperture can be reduced to NAO=0.0625 or NAO=0.0825, where in this case a chief ray angle $\alpha$ of 6° can simultaneously be realized.

In the image plane 5, the imaging rays 6 to 8 impinge on the image field 4 almost perpendicularly to the image plane 5 and almost parallel to one another.

In the imaging beam path between the object field 2 and the image field 4, the imaging optical unit 1 has exactly four mirrors, which are designated hereinafter by M1, M2, M3 and M4 in the order in which they are arranged in the imaging beam path.

The decenterable and exchangeable aperture stop can be arranged in the structural space between the object plane 3 and the mirror M2. This is not illustrated in FIG. 1.

The first mirror M1 in the beam path between the object field 2 and the image field 4 is aspherical, and the mirrors M2 to M4 are spherical.

FIG. 1 illustrates the curves of intersection of parent surfaces which are used for the mathematical modeling of the reflection surfaces of the mirrors M1 to M4. Those regions of the reflection surfaces of the mirrors M1 to M4 to which the coma rays 7, 8 are applied and between the coma rays 7, 8 imaging radiation is actually applied are actually physically present in the sectional plane illustrated.

The object field 2 of the imaging optical unit 1 according to FIG. 1 is spaced apart from an optical axis OA (off-axis). The optical axis is the common axis of rotational symmetry of the reflection surfaces of the imaging optical unit 1, that is to say of the mirrors M1 to M4.

An intermediate image 10 lies in the imaging beam path between the mirrors M1 and M2.

The imaging optical unit 1 is designed for an operating wavelength of 13.5 nm. The imaging optical unit 1 has an object-side numerical aperture of 0.125.

Optical data of the imaging optical unit 1 according to FIG. 1 are reproduced below with the aid of two tables. In the column "Radius", the first table shows the respective radius of curvature of the mirrors M1 to M4. The third column (Thickness) describes the distance, proceeding from the object plane 3, in each case to the downstream surface in the z-direction.

The second table describes the exact surface shape of the reflection surfaces of the mirror M1, wherein the constants K and A to E should be inserted into the following equation for the sagitta:

$$z(h) = \frac{ch^2}{1 + SQRT\{1 - (1 + K)c^2h^2\}} + Ah^4 + Bh^6 + Ch^8 + Dh^{10} + Eh^{12}(+Fh^{14} + Gh^{16})$$

In this case, h represents the distance from the optical axis, that is to say from the normal 9, of the imaging optical unit 1. $h^2=x^2+y^2$ therefore holds true. The reciprocal of "Radius" is inserted into the equation for c.

| Surface | Radius | Thickness | Operating mode |
|---|---|---|---|
| Object | Infinite | 766.379 | |
| M1 | −634.450 | −566.379 | REFL |
| M2 | 48.631 | 750.000 | REFL |
| M3 | 43.338 | −720.000 | REFL |
| M4 | 1496.835 | 770.000 | REFL |
| Image | Infinite | 0.000 | |

| Surface | K | A | B |
|---|---|---|---|
| M1 | 0.000000E+00 | 1.891093E−11 | 4.656758E−17 |

| Surface | C | D | E |
|---|---|---|---|
| M1 | 8.629548E−23 | 5.759097E−28 | −1.805617E−33 |

The table below reproduces the angles of incidence of the chief ray 6 of the central object field point and the maximum angles of incidence of the imaging rays 6 to 8 on the individual mirrors M1 to M4:

| | Angle of incidence of the chief ray of the central field point | Maximum angle of incidence of the imaging rays in meridional section |
|---|---|---|
| M1 | 1.64° | 3.03° |
| M2 | 5.58° | 10.34° |
| M3 | 4.55° | 7.98° |
| M4 | 4.62° | 7.78° |

The maximum angle of incidence is 10.34°, that is to say less than 11°. For these maximum angles of incidence it suffices to apply the mirrors M1 to M4 for the operating wavelength at 13.5 nm with a multilayer coating having an individual layer thickness that is constant over the used reflection surface of the mirrors M1 to M4. With comparatively simple production, this results in high reflectances of the mirrors M1 to M4 and a correspondingly high throughput of the imaging optical unit 1 for the operating wavelength of 13.5 nm.

The imaging optical unit 1 has a Petzval radius having an absolute value of 1.874 mm. The absolute value of the Petzval radius is therefore greater than 500 mm.

A definition of the Petzval radius can be found in the reference book by H. Gross, Handbook of Optics, Vol. 1, Wiley-VCH-Verlag, Weinheim, 2005, page 514, formula 11-37. Accordingly, the following holds true for the absolute value of the Petzval radius $|R_p|$ of a mirror system composed of m mirrors:

$$|R_p| = \frac{1}{2 \cdot \sum_{i=1}^{m} \frac{\alpha_i}{|R_i|}}$$

where $|R_i|$ is the absolute value of the radius of the i-th mirror, and $\alpha_i=1$ for concave mirrors and $\alpha_i=-1$ for convex mirrors.

A structural length T, that is to say a distance between the object plane 3 and the image plane 5, is 1000 mm. A ratio of the absolute value of the Petzval radius and the structural length T is therefore 1874/1000=1.874. A ratio of the structural length T and the imaging scale β is 1000 mm/750=1.33 mm.

A field radius in the object plane 3 is 0.27 mm.

A wavefront aberration (rms) over the image field 4 is 10.7 mλ in the case of the imaging optical unit 1. A distortion over the image field 4 is 3.0 μm in the case of the imaging optical unit 1 according to FIG. 1.

The imaging optical unit 1 is telecentric on the image side.

The imaging optical unit 1 is therefore part of a metrology system. This metrology system also includes a light source, which provides illumination light having the operating wavelength of 13.5 mm, and an illumination optical unit for illuminating the object field 2 and the CCD chip already discussed in connection with the image field 4, the chip being part of a detection device of the metrology system.

Appropriate light sources include the light sources that are also customary for lithography systems, that is to say, for example, laser plasma sources (LPP; laser produced plasma) or else discharge sources (DPP; discharge produced plasma).

Figure 2:
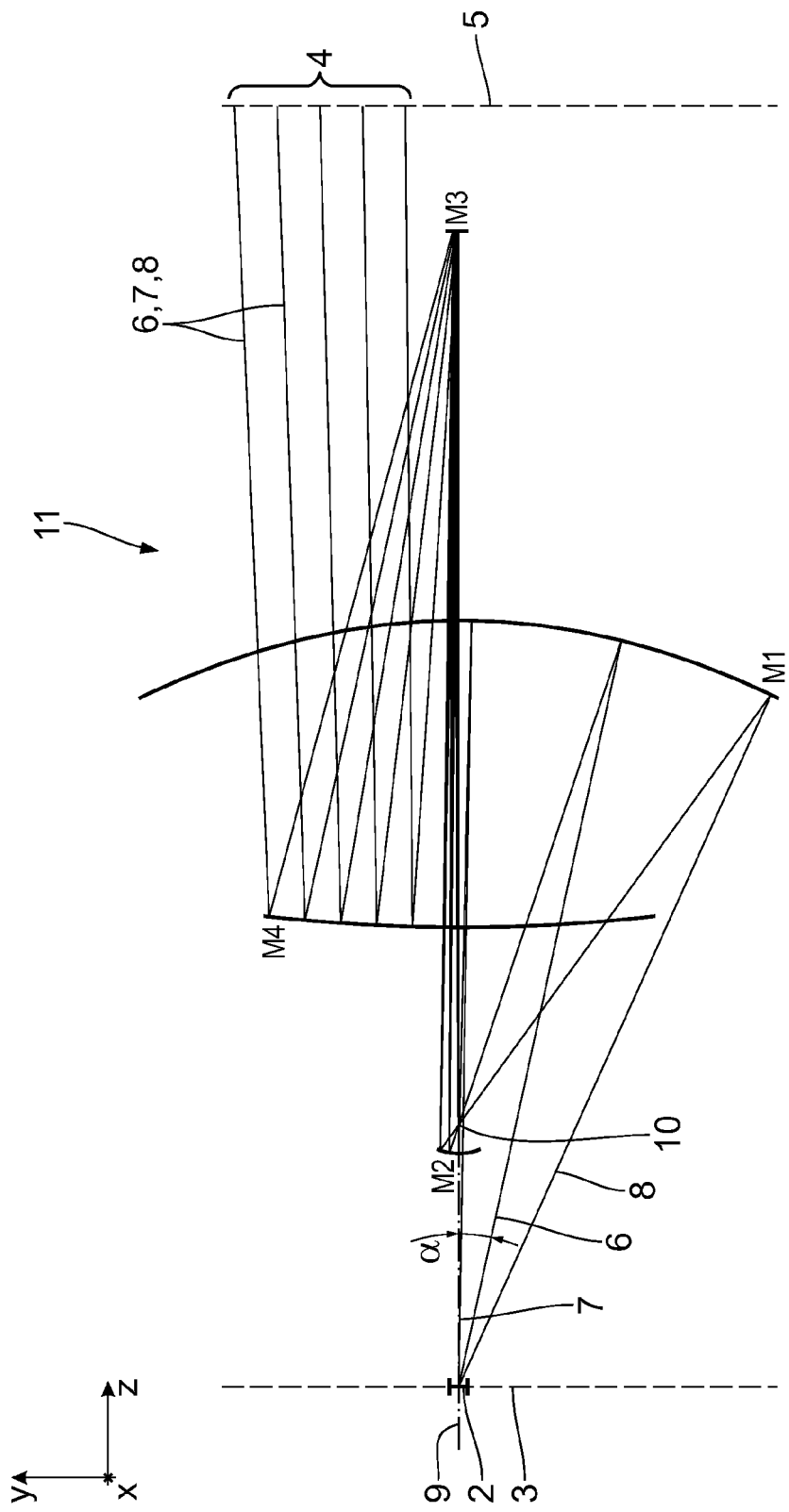
FIGS. 2 to 6 show, in each case in an illustration similar to FIG. 1, further embodiments, respectively of an imaging optical unit.

With reference to FIG. 2, a description is given below of a further embodiment of an imaging optical unit 11, which can be used instead of the imaging optical unit 1 according to FIG. 1. Components and functions corresponding to those which have already been explained above with reference to FIG. 1 bear the same reference numerals and will not be discussed in detail again.

In the case of the imaging optical unit 11, the first two mirrors M1, M2 in the imaging beam path between the object field 2 and the image field 4 are configured aspherically and the other two mirrors M3, M4 are configured spherically.

The optical data of the imaging optical unit 11 according to FIG. 2 are reproduced below with the aid of two tables, which correspond in terms of structure to the tables of the imaging optical unit 1 according to FIG. 1.

| Surface | Radius | Thickness | Operating mode |
|---|---|---|---|
| Object | Infinite | 790.693 | |
| M1 | −626.779 | −549.153 | REFL |
| M2 | 58.207 | 950.816 | REFL |
| M3 | 50.826 | −717.735 | REFL |
| M4 | 1802.618 | 848.454 | REFL |
| Image | Infinite | 0.000 | |

| Surface | K | A | B |
|---|---|---|---|
| M1 | 0.000000E+00 | 2.707352E−11 | 6.745898E−17 |
| M2 | 0.000000E+00 | 8.961529E−08 | 0.000000E+00 |

| Surface | C | D | E |
|---|---|---|---|
| M1 | 1.689709E−22 | 2.064012E−28 | 1.923308E−33 |
| M2 | 0.000000E+00 | 0.000000E+00 | 0.000000E+00 |

The angles of incidence of the chief ray 6 of the central object field point and the maximum angles of incidence of the imaging rays 6 to 8 in meridional section on the individual mirrors M1 to M4 are summarized in the following table:

|    | Angle of incidence of the chief ray of the central field point | Maximum angle of incidence of the imaging rays in meridional section |
|----|----|----|
| M1 | 3.15° | 5.66° |
| M2 | 9.14° | 16.75° |
| M3 | 4.17° | 7.17° |
| M4 | 5.08° | 8.19° |

The maximum angle of incidence is 16.75°, that is to say less than 20°, and in particular less than 17°. Here, too, it is possible, with comparatively simple production, to apply a highly reflective multilayer coating to the mirrors of the imaging optical unit.

The absolute value of the Petzval radius is 1452 mm in the case of the imaging optical unit 11. A structural length T, that is to say a distance between the object plane 3 and the image plane 5, is 1323 mm. A ratio of the absolute value of the Petzval radius and the structural length is therefore 1452/1323=1.097. A ratio of the structural length T and the imaging scale β is 1323 mm/750=1.764.

A field radius in the object plane 3 is 0.29 mm.

A wavefront aberration (rms) over the image field 4 is 6.4 mλ. A distortion over the image field 4 is 0.8 μm.

The imaging optical unit 11 has an object-side numerical aperture of 0.2.

Figure 3:
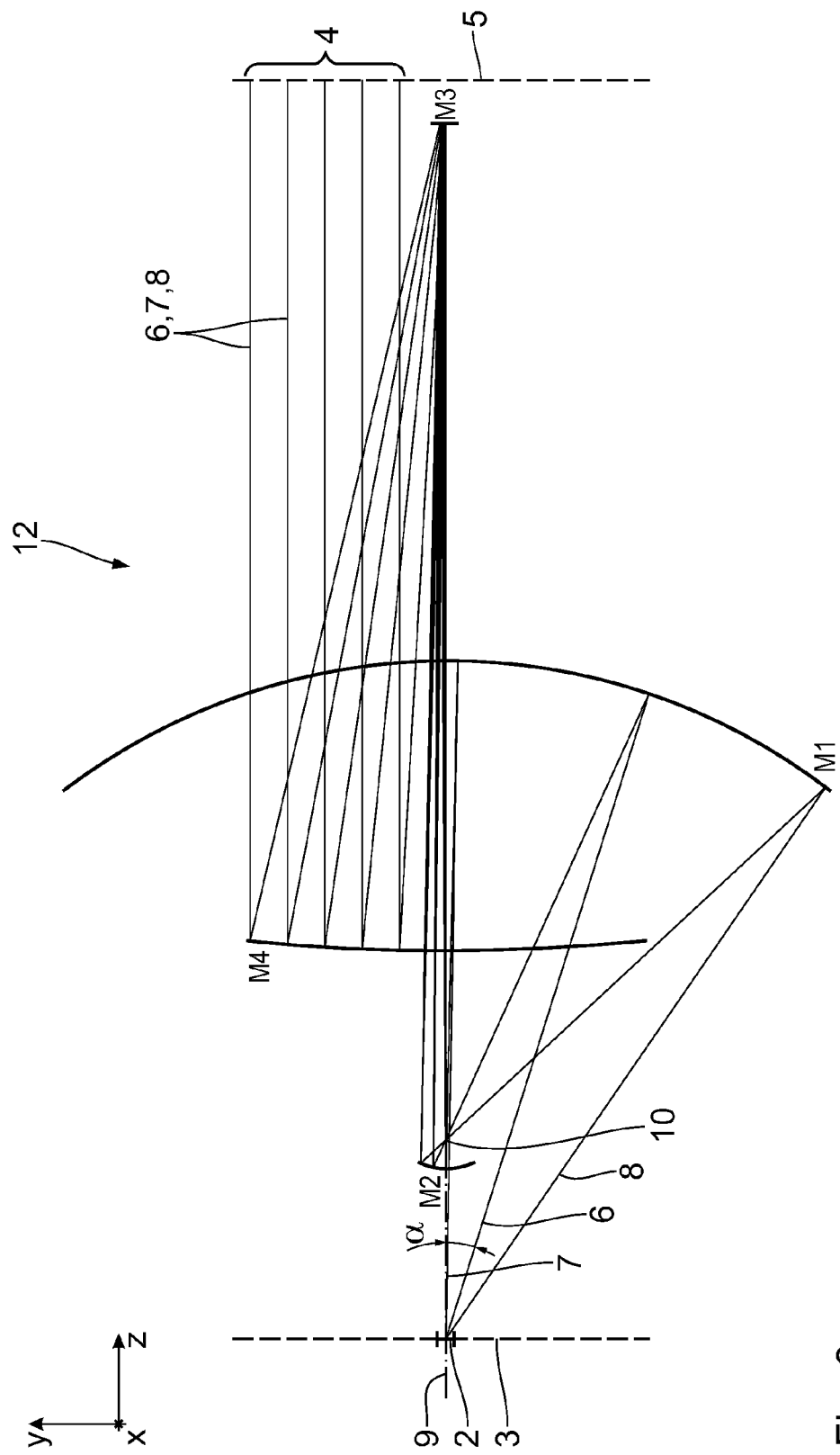

With reference to FIG. 3, a description is given below of a further embodiment of an imaging optical unit 12, which can be used instead of the imaging optical unit 1 according to FIG. 1. Components and functions corresponding to those which have already been explained above with reference to FIG. 1 bear the same reference numerals and will not be discussed in detail again.

As in the case of the imaging optical unit 11, in the case of the imaging optical unit 12 as well, the first two mirrors M1, M2 in the imaging beam path are configured aspherically and the subsequent mirrors M3, M4 are configured spherically.

The absolute value of the Petzval radius of the imaging optical unit 12 is 2469 mm. A structural length T, that is to say a distance between the object plane 3 and the image plane 5, is 1487 mm. A ratio of the absolute value of the Petzval radius and the structural length is therefore 2469/1487=1.66. A ratio of the structural length T and the imaging scale β is 1983 mm/750=1.764.

A field radius in the object plane 3 is 0.29 mm.

A wavefront aberration (rms) over the image field 4 is 37.6 mλ. A distortion over the image field 4 is 2.0 μm.

The optical unit 12 is telecentric on the image side.

An object-side numerical aperture of the imaging optical unit 12 is 0.3. This high object-side numerical aperture enables not only a PMI or AIMS inspection of a patterned lithography mask, but even an inspection of an unpatterned, but coated mask substrate.

Such an inspection is also referred to as a "mask blank inspection". With the imaging optical unit 12 and a metrology system that uses the latter, therefore, a complete three-stage mask qualification is possible, wherein an inspection of the unpatterned, coated mask substrate takes place in a first stage, a PMI inspection takes place in a second stage and an AIMS inspection takes place in the third stage.

The optical data of the imaging optical unit 12 according to FIG. 3 are reproduced below with the aid of two tables, which correspond in terms of structure to the tables of the imaging optical unit 1 according to FIG. 1.

| Surface | Radius | Thickness | Operating mode |
|----|----|----|----|
| Object | Infinite | 800.000 | |
| M1 | −660.196 | −600 | REFL |
| M2 | 73.818 | 1237.379 | REFL |
| M3 | 63.464 | −978.717 | REFL |
| M4 | 2029.425 | 1028.717 | REFL |
| Image | Infinite | 0.000 | |

| Surface | K | A | B | C |
|----|----|----|----|----|
| M1 | 0.000000E+00 | 1873121E−11 | 4.428369E−17 | 6.822138E−23 |
| M2 | 0.000000E+00 | −1.476918E−08 | 2.336578E−11 | −6.225633E−14 |

| Surface | D | E | F | G |
|----|----|----|----|----|
| M1 | 3.820172E−28 | −3.704056E−34 | 1.490307E−39 | 5.851042E−45 |
| M2 | 1.414603E−16 | −1.761460E−19 | 1.180267E−22 | −3.255700E−26 |

The angles of incidence of the chief ray 6 of the central object field point and the maximum angles of incidence of the imaging rays 6 to 8 in meridional section on the individual mirrors M1 to M4 are summarized in the following table:

|    | Angle of incidence of the chief ray of the central field point | Maximum angle of incidence of the imaging rays in meridional section |
|----|----|----|
| M1 | 3.72° | 6.22° |
| M2 | 12.57° | 22.10° |
| M3 | 3.53° | 6.29° |
| M4 | 3.81° | 6.15° |

The maximum angle of incidence is 22.10°, that is to say, in particular, less than 25°. Here, too, it is possible, with comparatively simple production, to apply a highly reflective multilayer coating to the mirrors of the imaging optical unit.

Figure 4:
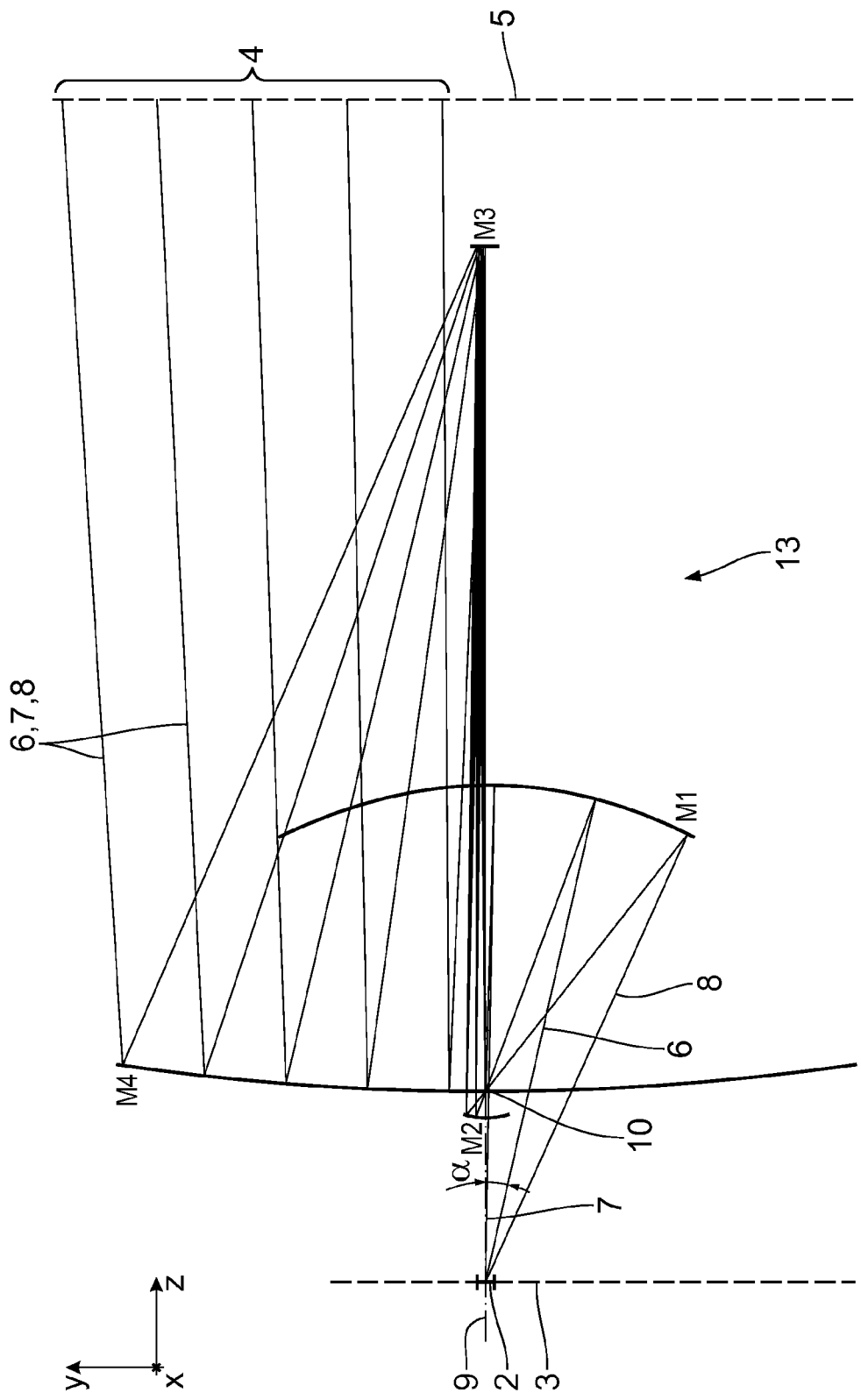

With reference to FIG. 4, a description is given below of a further embodiment of an imaging optical unit 13, which can be used instead of the imaging optical unit 1 according to FIG. 1. Components and functions corresponding to those which have already been discussed above with reference to FIG. 1 bear the same reference numerals and will not be discussed in detail again.

The absolute value of the Petzval radius of the imaging optical unit 13 is 5027 mm. A structural length T, that is to say a distance between the object plane 3 and the image plane 5, is 1500 mm. A ratio of the absolute value of the Petzval radius and the structural length is therefore 5027/1500=3.351. A ratio of the structural length T and the imaging scale β is 1500 mm/750=2 mm.

A field radius in the object plane 3 is 0.67 mm.

A wavefront aberration (rms) over the image field 4 is 26.0 mλ. A distortion over the image field 4 is 5.7 μm.

An object-side numerical aperture of the imaging optical unit 13 is 0.2.

The optical data of the imaging optical unit 13 according to FIG. 4 are reproduced below with the aid of two tables, which correspond in terms of structure to the tables of the imaging optical unit 1 according to FIG. 1.

| Surface | Radius    | Thickness  | Operating mode |
|---------|-----------|------------|----------------|
| Object  | Infinite  | 630.067    |                |
| M1      | −477.097  | −422.629   | REFL           |
| M2      | 74.917    | 1105.288   | REFL           |
| M3      | 62.816    | −1072.074  | REFL           |
| M4      | 2658.819  | 1259.348   | REFL           |
| Image   | Infinite  | 0.000      |                |

| Surface | K            | A             | B              | C             |
|---------|--------------|---------------|----------------|---------------|
| M1      | 0.000000E+00 | 8.657800E−11  | 3.708934E−16   | −4.276723E−23 |
| M2      | 0.000000E+00 | −7.860763E−08 | −7.484639E−12  | −4.374040E−24 |

| Surface | D            | E            | F            | G            |
|---------|--------------|--------------|--------------|--------------|
| M1      | 6.944037E−27 | 3.767298E−08 | 2.602137E−37 | 0.000000E+00 |
| M2      | 0.000000E+00 | 0.000000E+00 | 0.000000E+00 | 0.000000E+00 |

The angles of incidence of the chief ray 6 of the central object field point and the maximum angles of incidence of the imaging rays 6 to 8 in meridional section on the individual mirrors M1 to M4 are summarized in the following table:

|    | Angle of incidence of the chief ray of the central field point | Maximum angle of incidence of the imaging rays in meridional section |
|----|----|----|
| M1 | 3.82° | 6.87° |
| M2 | 9.81° | 17.91° |
| M3 | 5.88° | 11.29° |
| M4 | 7.04° | 12.67° |

The maximum angle of incidence is 17.91°, that is to say less than 20°, and in particular less than 18°. Here, too, it is possible, with comparatively simple production, to apply a highly reflective multilayer coating to the mirrors of the imaging optical unit.

Figure 5:
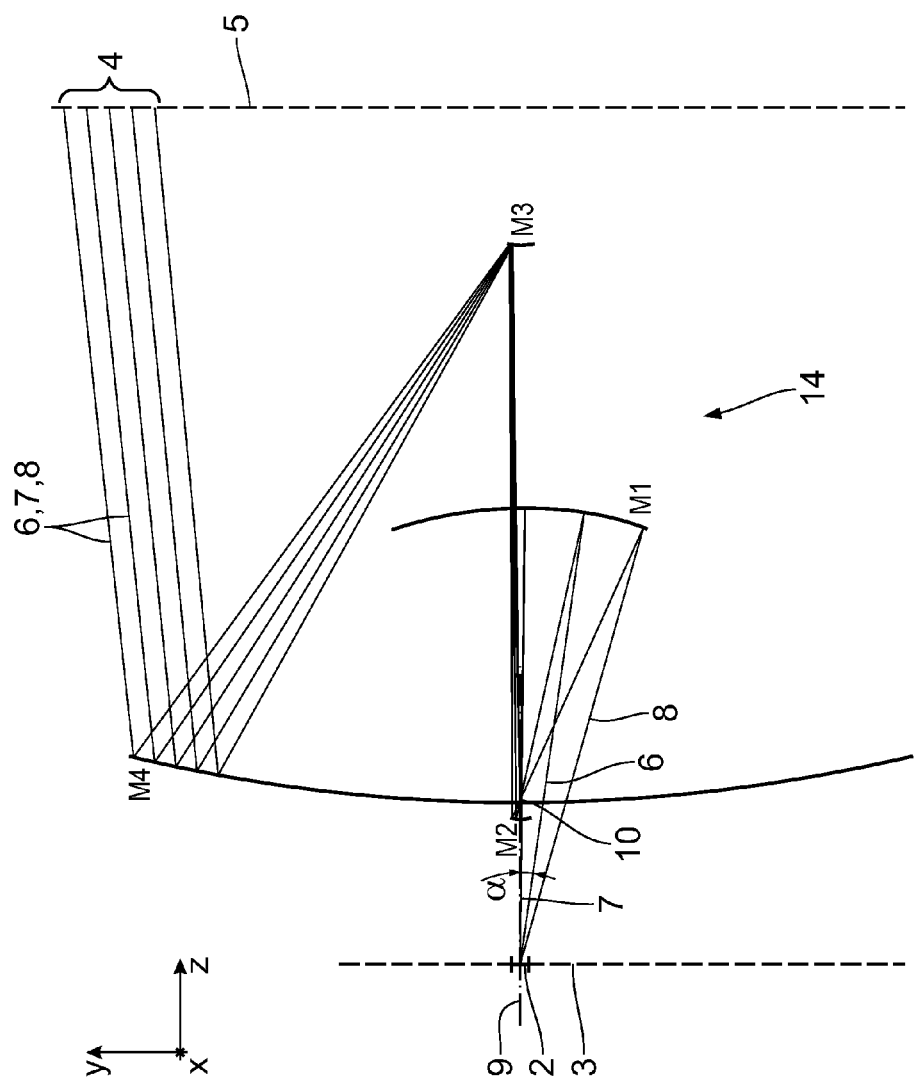

With reference to FIG. 5, a description is given below of a further embodiment of an imaging optical unit 14, which can be used instead of the imaging optical unit 1 according to FIG. 1. Components and functions corresponding to those which have already been explained above with reference to FIG. 1 bear the same reference numerals and will not be discussed in detail again.

The absolute value of the Petzval radius of the imaging optical unit 14 is 658.7 mm. A structural length T, that is to say a distance between the object plane 3 and the image plane 5, is 1500 mm. A ratio of the absolute value of the Petzval radius and the structural length is therefore 658.7/1500=0.439. A ratio of the structural length T and the imaging scale β is 1500 mm/750=2 mm.

A field radius in the object plane 3 is 1.00 mm. On account of this large field radius, the object field 2 can be significantly enlarged in the x-direction. In the case of the imaging optical unit 14, unlike in the case of the imaging optical units 1, 11, 12, and 13, an x/y aspect ratio of the object field 2 is no longer 1:1, which corresponds to a square field shape, but rather 5:1. The object field 2 in this case has, in an x/y plan view, the shape of a ring field segment having the dimensions of 1.0 mm×0.2 mm.

A wavefront aberration (rms) over the image field 4 is 11.6 mλ. A distortion over the image field 4 is 1.0 μm.

An object-side numerical aperture of the imaging optical unit 14 is 0.125.

The optical data of the imaging optical unit 14 according to FIG. 5 are reproduced below with the aid of two tables, which correspond in terms of structure to the tables of the imaging optical unit 1 according to FIG. 1.

| Surface | Radius    | Thickness | Operating mode |
|---------|-----------|-----------|----------------|
| Object  | Infinite  | 800.000   |                |
| M1      | −623.848  | −546.796  | REFL           |
| M2      | 68.700    | 1006.773  | REFL           |
| M3      | 63.337    | −976.773  | REFL           |
| M4      | 2572.541  | 1216.796  | REFL           |
| Image   | Infinite  | 0.000     |                |

| Surface | K            | A             | B             | C             |
|---------|--------------|---------------|---------------|---------------|
| M1      | 0.000000E+00 | 3.116367E−11  | 7.886056E−17  | 1.725819E−22  |
| M2      | 0.000000E+00 | −6.977090E−08 | −4.818854E−12 | 0.000000E+00  |

| Surface | D            | E            | F            | G            |
|---------|--------------|--------------|--------------|--------------|
| M1      | 6.117098E−28 | 0.000000E+00 | 0.000000E+00 | 0.000000E+00 |
| M2      | 0.000000E+00 | 0.000000E+00 | 0.000000E+00 | 0.000000E+00 |

The angles of incidence of the chief ray 6 of the central object field point and the maximum angles of incidence of the imaging rays 6 to 8 in meridional section on the individual mirrors M1 to M4 are summarized in the following table:

| | Angle of incidence of the chief ray of the central field point | Maximum angle of incidence of the imaging rays in meridional section |
|---|---|---|
| M1 | 2.13° | 4.11° |
| M2 | 6.35° | 11.54° |
| M3 | 15.68° | 17.70° |
| M4 | 18.17° | 20.10° |

The maximum angle of incidence is 20.10°, that is to say less than 25°, and in particular less than 21°. Here, too, it is possible, with comparatively simple production, to apply a highly reflective multilayer coating to the mirrors of the imaging optical unit.

Figure 6:
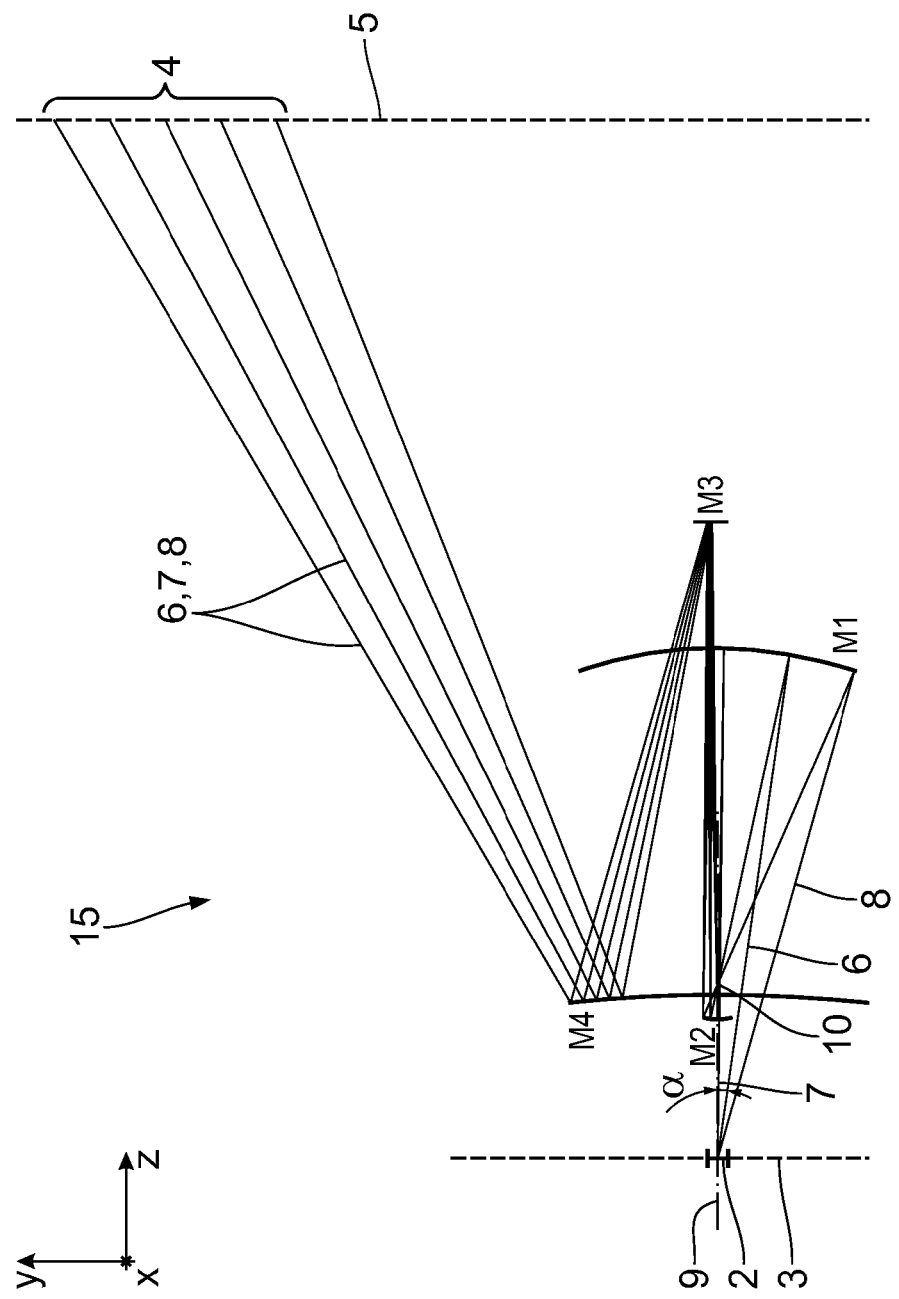

With reference to FIG. 6, a description is given below of a further embodiment of an imaging optical unit 15, which can be used instead of the imaging optical unit 1 according to FIG. 1. Components and functions corresponding to those which have already been explained above with reference to FIG. 1 bear the same reference numerals and will not be discussed in detail again.

In the case of the imaging optical unit 15, all four mirrors M1 to M4 are configured aspherically.

The last mirror M4 of the imaging optical unit 15 is convex. The image field 4 of the imaging optical unit 15 can then be arranged greatly off-axis, that is to say can be spaced apart far from the optical axis, without the extent of a reflection surface of the last mirror M4 simultaneously having to be particularly large. The reflection surface of the mirror M4 has an extent of 166 mm in the x-direction and thus only 22% of the x-extent of the image field 4, which is 750 mm. The distance between the mirror M4 and the optical axis is small compared with the distance between the image field 4 and the optical axis, such that the imaging optical unit 15 has a compact arrangement of the mirrors M1 to M4.

The absolute value of the Petzval radius of the imaging optical unit 15 is 2907 mm. A structural length T, that is to say a distance between the object plane 3 and the image plane 5, is 1500 mm. A ratio of the absolute value of the Petzval radius and the structural length is therefore 2907/1500=1.94. A ratio of the structural length T and the imaging scale β is 1500 mm/750=2 mm.

A field radius in the object plane 3 is 1.20 mm. On account of this large field radius, the object field 2 can be significantly enlarged in the x-direction. In the case of the imaging optical unit 15, unlike in the case of the imaging optical units 1, 11, 12, and 13, an x/y aspect ratio of the object field 2 is no longer 1:1, which corresponds to a square field shape, but rather 2.5:1. The object field 2 in this case has, in an x/y plan view, the shape of a ring field segment having the dimensions of 1.0 mm×0.4 mm.

A wavefront aberration (rms) over the image field 4 is 6.4 mλ. A distortion over the image field 4 is 0.4 μm.

An object-side numerical aperture of the imaging optical unit 15 is 0.125.

The optical data of the imaging optical unit 15 according to FIG. 6 are reproduced below with the aid of two tables, which correspond in terms of structure to the tables of the imaging optical unit 1 according to FIG. 1.

| Surface | Radius | Thickness | Operating mode |
|---|---|---|---|
| Object | Infinite | 835.844 | |
| M1 | −583.815 | −535.844 | REFL |
| M2 | 97.339 | 718.885 | REFL |
| M3 | 87.946 | −680.432 | REFL |
| M4 | −1269.615 | 1261.547 | REFL |
| Image | Infinite | 0.000 | |

| Surface | K | A | B | C |
|---|---|---|---|---|
| M1 | 0.000000E+00 | 3.829562E−11 | 1.113769E−17 | 2.804867E−22 |
| M2 | 0.000000E+00 | −1.692348E−08 | 0.000000E+00 | 0.000000E+00 |
| M3 | 0.000000E+00 | 1.116351E−07 | 0.000000E+00 | 0.000000E+00 |
| M4 | 0.000000E+00 | 1.651832E−09 | −8.506884E−15 | 4.555318E−20 |

| Surface | D | E | F | G |
|---|---|---|---|---|
| M1 | 1.098589E−27 | 0.000000E+00 | 0.000000E+00 | 0.000000E+00 |
| M2 | 0.000000E+00 | 0.000000E+00 | 0.000000E+00 | 0.000000E+00 |
| M3 | 0.000000E+00 | 0.000000E+00 | 0.000000E+00 | 0.000000E+00 |
| M4 | −1.480848E−25 | 0.000000E+00 | 0.000000E+00 | 0.000000E+00 |

The angles of incidence of the chief ray 6 of the central object field point and the maximum angles of incidence of the imaging rays 6 to 8 in meridional section on the individual mirrors M1 to M4 are summarized in the following table:

| | Angle of incidence of the chief ray of the central field point | Maximum angle of incidence of the imaging rays in meridional section |
|---|---|---|
| M1 | 1.94° | 3.69° |
| M2 | 5.87° | 10.75° |
| M3 | 6.29° | 8.04° |
| M4 | 18.68° | 21.99° |

The maximum angle of incidence is 21.99°, that is to say less than 25°, and in particular less than 22°. Here, too, it is possible, with comparatively simple production, to apply a highly reflective multilayer coating to the mirrors of the imaging optical unit.

The structural length T always relates to an unfolded configuration of the imaging optical unit, that is to say to a configuration without interposed plane mirrors having a purely deflecting effect. The structural length T is defined either by the distance between the object field and the image field, by the distance between the object field and the optical component most distant therefrom, or by the distance between the image field and the optical component most distant therefrom.

What is claimed is:

1. An imaging optical unit having an object field in an object plane and an image field in an image plane, the imaging optical unit comprising:
    at least four mirrors configured to image the object field into the image field,
    wherein the imaging optical unit has an absolute value of a Petzval radius that is greater than 500 mm, and the imaging optical unit has an imaging scale that is greater than 500.

2. The imaging optical unit of claim 1, wherein a ratio of an absolute value of the Petzval radius and a structural length of the imaging optical unit is at least 0.4.

3. The imaging optical unit of claim 1, wherein at least one of the at least four mirrors has no opening for passing imaging light.

4. The imaging optical unit of claim 1, wherein the object field has a size of at least 0.01 mm$^2$.

5. The imaging optical unit of claim 1, wherein the imaging optical unit has an object-side numerical aperture of at least 0.0625.

6. The imaging optical unit of claim 1, wherein the imaging optical unit has an object-side chief ray angle of at least 6°.

7. The imaging optical unit of claim 1, wherein a maximum angle of incidence of a chief ray of a central field point on one of the at least four mirrors is 11°.

8. The imaging optical unit of claim 1, wherein the imaging optical unit has a maximum wavefront aberration (rms) of 25 m$\lambda$.

9. The imaging optical unit of claim 8, wherein the imaging optical unit has a maximum distortion of 1000 nm.

10. The imaging optical unit of claim 1, wherein the imaging optical unit has a maximum distortion of 1000 nm.

11. The imaging optical unit of claim 1, wherein the at least four mirrors is exactly four mirrors.

12. A system, comprising:
    an imaging optical unit having an object field in an object plane and an image field in an image plane, the imaging optical unit comprising at least four mirrors configured to image an object field in an object plane into an image field in an image plane,
    wherein the imaging optical unit has an absolute value of a Petzval radius that is greater than 500 mm, the imaging optical unit has an imaging scale that is greater than 500, and the system is a metrology system.

13. The system of claim 12, further comprising a light source configured to illuminate the object field.

14. The system of claim 13, further comprising a detection device configured to detect the image field.

15. The system of claim 14, wherein the detector is configured to provide spatially resolved detection.

16. The system of claim 12, further comprising a detection device configured to detect the image field.

17. The system of claim 16, wherein the detector is configured to provide spatially resolved detection.

18. A method, comprising:
    using a system to inspect a mask, the system comprising:
    an imaging optical unit comprising at least four mirrors configured to image an object field in an object plane into an image field in an image plane,
    wherein the imaging optical unit has an absolute value of a Petzval radius that is greater than 500 mm, the imaging optical unit has an imaging scale that is greater than 500, and the system is a metrology system.

19. The method of claim 18, wherein the mask comprises a patterned lithography mask.

20. The method of claim 18, wherein the mask comprises an unpatterned, coated substrate.

* * * * *

UNITED STATES PATENT AND TRADEMARK OFFICE
CERTIFICATE OF CORRECTION

PATENT NO.       : 8,842,284 B2
APPLICATION NO.  : 13/357222
DATED            : September 23, 2014
INVENTOR(S)      : Hans-Juergen Mann It is certified that error appears in the above-identified patent and that said Letters Patent is hereby corrected as shown below:

In the Specification

Col. 1, line 11, delete "10 2009 034 583.9," and insert -- 10 2009 035 583.9, --.

Col. 8, lines 1 through 10 should be one paragraph.

Signed and Sealed this
Thirteenth Day of January, 2015

Michelle K. Lee
*Deputy Director of the United States Patent and Trademark Office*